(12) United States Patent
Kim et al.

(10) Patent No.: US 8,773,220 B2
(45) Date of Patent: Jul. 8, 2014

(54) RADIO FREQUENCY FRONT END MODULE AND MULTI BAND MODULE USING THE RADIO FREQUENCY FRONT END MODULE

(75) Inventors: Chul Soo Kim, Hwaseong-si (KR); Jun Chul Kim, Seongnam-si (KR); Dong Su Kim, Seongnam-si (KR); In Sang Song, Yongin-si (KR); Duck Hwan Kim, Goyang-si (KR); Yun Kwon Park, Dongducheon-si (KR); Jea Shik Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 796 days.

(21) Appl. No.: 12/818,249

(22) Filed: Jun. 18, 2010

(65) Prior Publication Data
US 2010/0321130 A1    Dec. 23, 2010

(30) Foreign Application Priority Data
Jun. 18, 2009   (KR) .................... 10-2009-0054378

(51) Int. Cl.
*H01P 5/12* (2006.01)

(52) U.S. Cl.
USPC ................. 333/126; 333/129; 333/132

(58) Field of Classification Search
USPC .................... 333/126, 129, 132, 133
See application file for complete search history.

(56) References Cited

U.S. PATENT DOCUMENTS

| | | | |
|---|---|---|---|
| 5,021,756 A * | 6/1991 | Tajima et al. | 333/132 |
| 5,815,052 A * | 9/1998 | Nakajima et al. | 333/175 |
| 7,127,269 B2 | 10/2006 | Shih | |
| 2003/0128168 A1 * | 7/2003 | Desargant et al. | 343/781 P |
| 2007/0002984 A1 * | 1/2007 | Hoon | 375/350 |
| 2007/0066245 A1 | 3/2007 | Snider | |
| 2008/0186106 A1 * | 8/2008 | Christian et al. | 333/133 |
| 2009/0017772 A1 | 1/2009 | Kemmochi et al. | |

FOREIGN PATENT DOCUMENTS

| | | |
|---|---|---|
| EP | 1850491 A2 * | 10/2007 |
| JP | 2004-200853 A | 7/2004 |
| JP | 2006-310904 A | 11/2006 |
| KR | 10-2004-0023745 A | 3/2004 |
| KR | 10-0875521 B1 | 12/2008 |

* cited by examiner

*Primary Examiner* — Robert Pascal
*Assistant Examiner* — Kimberly Glenn
(74) *Attorney, Agent, or Firm* — NSIP Law

(57) ABSTRACT

Disclosed are a radio frequency (RF) front end module and a multi-band communication module using the RF front end module. The RF front end module may use a plurality of bandpass filters and at least one diplexer being connected to at least one of front ends or rear ends of two bandpass filters of the plurality of bandpass filters.

11 Claims, 11 Drawing Sheets

RADIO FREQUENCY FRONT END MODULE AND MULTI BAND MODULE USING THE RADIO FREQUENCY FRONT END MODULE

CROSS-REFERENCE TO RELATED APPLICATION(S)

This application claims the benefit under 35 U.S.C. §119 (a) of a Korean Patent Application No. 10-2009-0054378, filed on Jun. 18, 2009, in the Korean Intellectual Property Office, the entire disclosure of which is incorporated herein by reference for all purposes.

BACKGROUND

1. Field

The following description relates to a radio frequency (RF) front end module using a diplexer and a bandpass filter, and a multi-band communication module using the RF front end module.

2. Description of Related Art

A radio frequency (RF) front end includes everything in a receiver which exists between an antenna and an intermediate frequency (IF) state. The RF front end requires a filter through which only a used band frequency is passed, to perform a wireless communication. However, where a plurality of band frequencies are used in a multi-band device, both a filter of each band and an additional component are used to prevent a filter of each band from having an effect on other bands.

In a dual-band device, a diplexer including a low-pass filter and a high-pass filter is a component used to prevent a filter of each band from having a detrimental effect on other bands. However, where at least three frequency bands are used, a combination of the above-described filters may have difficulty in preventing a detrimental effect on other bands. In this instance, a switch device based on a monolithic microwave integrated circuit (MMIC) may be used. The switch device enhances an isolation characteristic between signal paths respectively corresponding to the frequency bands, and as a result, an enhanced attenuation characteristic of a filter is experienced. However, an insertion loss characteristic, which is a loss of signal power resulting from an insertion of a device in a transmission line or optical fiber, decreases as a result of the use of the switch device. In other words, the insertion loss characteristic is inversely proportional to the attenuation characteristic, and thus, the insertion loss characteristic decreases in response to the enhanced attenuation characteristic.

Accordingly, an RF front end module that combines both the convenience of design provided by using a switch and the advantage of using a diplexer, and a multi-band communication module utilizing the RF front end module, are desirable.

SUMMARY

In one general aspect, there is provided an RF front end module including a bandpass filter through which a predetermined band signal is passed, and a diplexer being connected to the bandpass filter.

The diplexer may be connected to a rear end of a basic unit filter, the basic unit filter including two bandpass filters.

The diplexer may include a first diplexer being connected to a front end of the basic unit filter, the basic unit filter including two bandpass filters, and a second diplexer being connected to a rear end of the basic unit filter.

The module may further include a phase shifter being connected to a front end of a basic unit filter, the basic unit filter including two bandpass filters, wherein the diplexer is connected to front ends of the phase shifter and another phase shifter.

According to another general aspect, there is provided a multi-band communication module including a bandpass filter through which a predetermined band signal is passed, a diplexer being connected to the bandpass filter, and a radio frequency integrated circuit being connected to the diplexer.

The diplexer may be connected to a rear end of a basic unit filter, the basic unit filter including two bandpass filters.

The diplexer may include a first diplexer being connected to a front end of the basic unit filter, the basic unit filter including two bandpass filters, and a second diplexer being connected to a rear end of the basic unit filter.

The diplexer may be connected to a rear end of a basic unit filter, the basic unit filter including two bandpass filters.

The diplexer may include a first diplexer being connected to a front end of the basic unit filter, the basic unit filter including two bandpass filters, and a second diplexer being connected to a rear end of the basic unit filter.

The module may further include a phase shifter being connected to a front end of the basic unit filter, the basic unit filter including two bandpass filters, wherein the diplexer is connected to front ends of the phase shifter and another phase shifter.

The module may further include an antenna being connected to front ends of the two bandpass filters, and a switch or a matching circuit between the antenna and the diplexer.

The module may further include a switch or a matching circuit between the two bandpass filters and the radio frequency integrated circuit.

The module may further include an antenna being connected to a front end of the bandpass filter, and a switch or a matching circuit between the antenna and the bandpass filter.

The module may further include a switch or a matching circuit between the diplexer and the radio frequency integrated circuit.

The radio frequency integrated circuit may include a low noise amplifier, or a mixer, or a power amp, or a drive amp, or any combination thereof.

The switch a Micro Electronic Mechanical System (MEMS), or a single-pole double-throw (SPDT) switch, or a double-pole double-throw (DPDT) switch, or any combination thereof.

Other features and aspects will be apparent from the following detailed description, the drawings, and the claims.

Figure 1:
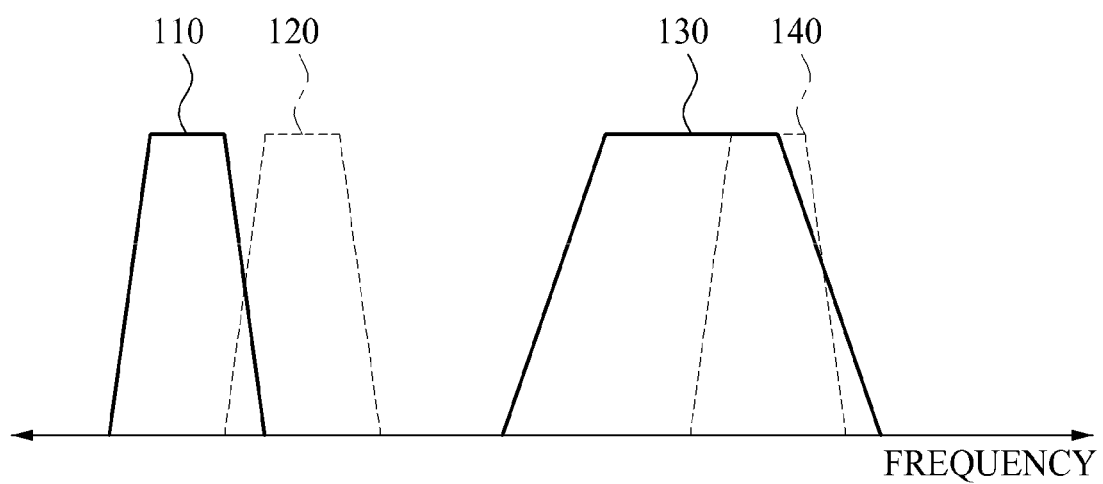
FIG. 1 is a diagram illustrating an example of a frequency band of a multi-band communication module.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

In the following description, when a first element is described as being connected to a second element, the first element may be directly connected to the second element without any intervening element therebetween, or may be indirectly connected to the second element through one or more intervening elements. Also, when a first element is described as being between a second element and a third element, the first element may be directly connected to the second element without any intervening element therebetween, or may be indirectly connected to the second element through one or more intervening elements, and may be directly connected to the third element without any intervening element therebetween, or may be indirectly connected to the third element through one or more intervening elements.

FIG. 1 illustrates an example of a frequency band of a multi-band communication module.

Referring to the multi-band communication module of FIG. 1, a quad-band frequency band where four frequency bands are used is illustrated. Here, a bandpass filter through which each band is passed uses four or more frequency bands. Where a band (1) 110 and a band (2) 120 are relatively close to each other, and a band (3) 130 and a band (4) 140 overlap significantly, a filter with a significantly enhanced attenuation characteristic may be used to prevent signals of other bands from interfering with signals from the bands 110, 120, 130, and 140. However, since an attenuation characteristic is typically inversely proportional to an insertion loss characteristic, deterioration of the insertion loss characteristic may occur due to the enhanced attenuation characteristic.

Furthermore, a dual band communication module may implement a diplexer including a low-pass filter and a high-pass filter. The low-pass filter may pass only a lower band of the two bands therethrough, and the high-pass filter may pass only a higher band of the two bands therethrough. A design of the dual band communication module implementing the diplexer may be relatively complicated as compared with a design of a dual band communication module implementing a switch. However, the dual band communication module implementing the diplexer may allow an attenuation characteristic in other bands to be improved by applying impedance matching to the other bands.

Figure 2:
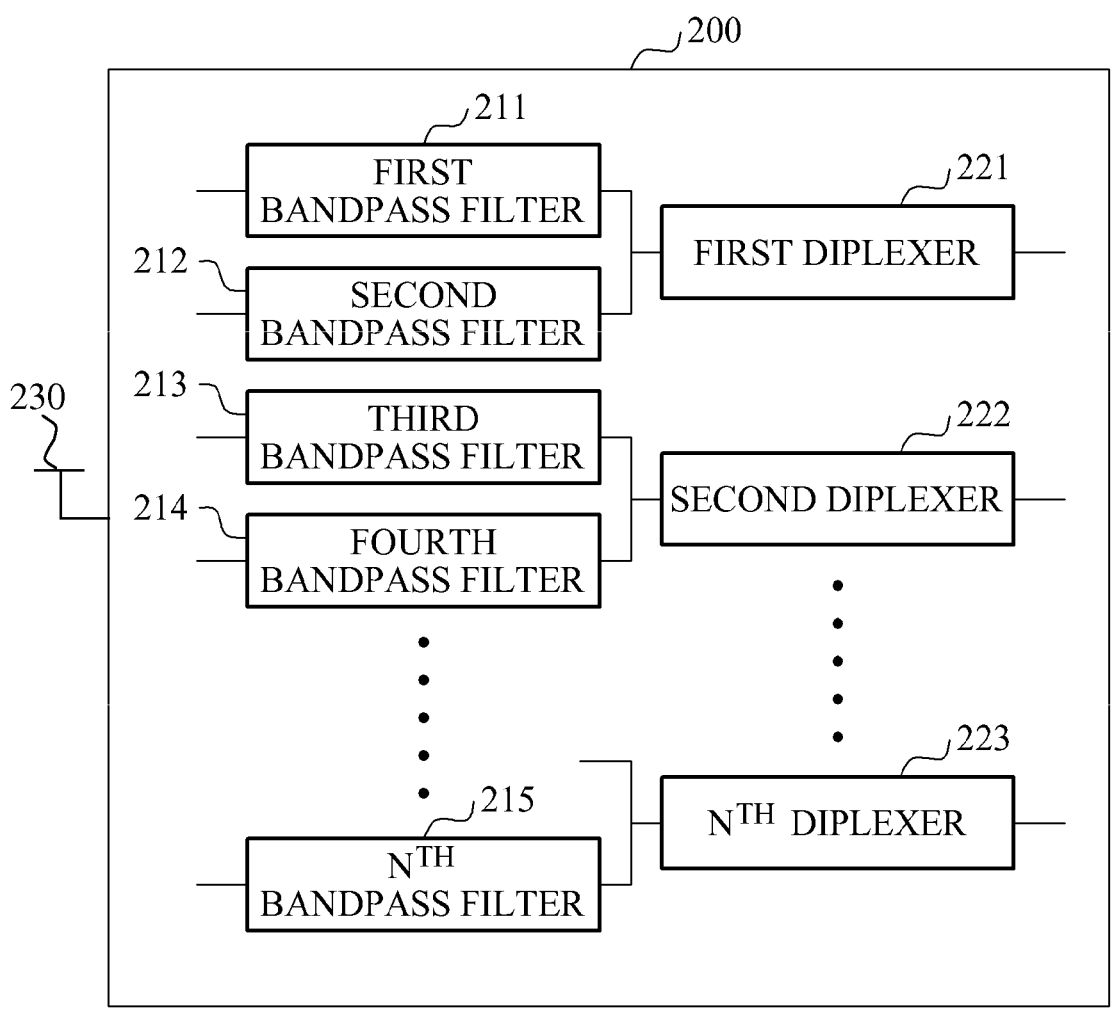
FIG. 2 is a diagram illustrating an example of a radio frequency (RF) front end module.

FIG. 2 illustrates an example of a radio frequency (RF) front end module 200.

Referring to FIG. 2, the RF front end module 200 includes a plurality of bandpass filters 211, 212, 213, 214, and 215, and at least one of a plurality of illustrated diplexers 221, 222, and 223.

The plurality of bandpass filters 211, 212, 213, 214, and 215 through which a predetermined band signal is passed, may be connected to a front end of the at least one of the plurality of illustrated diplexers 221, 222, and 223. Also, the plurality of bandpass filters 211, 212, 213, 214, and 215 may be connected to signal lines from a direction of an antenna 230. As an example, a first bandpass filter 211 and a second bandpass filter 212 may be connected to signal lines from the direction of the antenna 230, and an output port of the first bandpass filter 211 and the second bandpass filter 212 is connected to a front end of the first diplexer 221. That is, the two bandpass filters, as a single basic unit, are connected to the front end of a single diplexer.

The at least one of the plurality of illustrated diplexers 221, 222, and 223 may include a dual input port and a single output port, and rear ends of the two bandpass filters of the plurality of bandpass filters 211, 212, 213, 214, and 215 may be connected to the dual input port. Referring to the first diplexer 221, a rear end of the first bandpass filter 211 and a rear end of the second bandpass filter 212 may be connected to a front end of the first diplexer 221, namely, the dual input port.

As described above, two bandpass filters, as a basic unit, are connected to a front end of a diplexer, and thus, an RF front end module that increases an attenuation characteristic thereof and also prevents deterioration of an insertion loss characteristic may be embodied.

Figure 3:
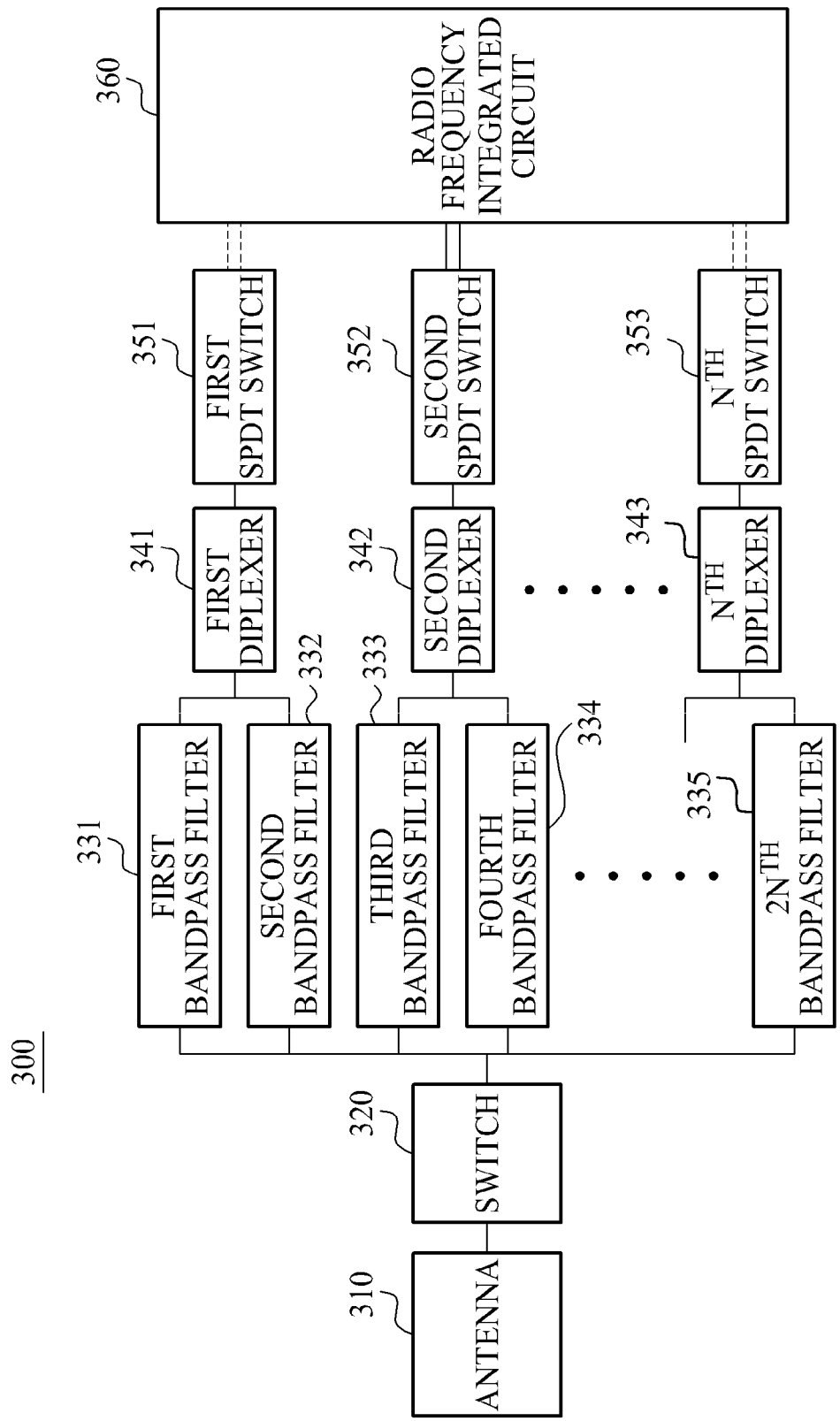
FIG. 3 is a diagram illustrating an example of a multi-band communication module using an RF front end module.

FIG. 3 illustrates an example of a multi-band communication module 300 using an RF front end module.

Referring to FIG. 3, the multi-band communication module 300 includes an antenna 310, a switch 320, a plurality of bandpass filters 331, 332, 333, 334, and 335, at least one of a plurality of illustrated diplexers 341, 342, and 343, and a radio frequency integrated circuit 360.

The antenna 310 may be connected to front ends of the plurality of bandpass filters 331, 332, 333, 334, and 335.

A predetermined band signal is passed through the plurality of bandpass filters 331, 332, 333, 334, and 335. In this instance, rear ends of the plurality of bandpass filters 331, 332, 333, 334, and 335 may be connected to front ends of the at least one of the plurality of illustrated diplexers 341, and 342, and 343. Also, the switch 320 or a matching circuit may be further included between the antenna 310 and the plurality of bandpass filters 331, 332, 333, 334, and 335. Here, the switch 320 may include at least one of a Micro Electronic Mechanical System (MEMS) switch and a double-pole double-throw (DPDT) switch.

Accordingly, the at least one diplexers 341 and 342 may be connected to rear ends of the plurality of bandpass filters 331, 332, 333, 334, and 335. In this instance, two bandpass filters may be connected to a single diplexer, and as an example, rear ends of the two bandpass filters 331 and 332 may be connected to a front end of the diplexer 341.

The radio frequency integrated circuit 360 may be connected to the at least one of the plurality of illustrated diplexers 341, 342, and 343. Here, the radio frequency integrated circuit 360 may include at least one of a low noise amplifier, a mixer, a power amp, and a drive amp.

Also, the multi-band communication module 300 further include switches 351, 352, and 353, or a matching circuit between the at least one of the plurality of illustrated diplexers 341, 342, and 343 and the radio frequency integrated circuit 360. Here, as described above, the switches 351, 352, and 353 may include at least one of the MEMS switch, a single-pole double-throw (SPDT) switch, and the DPDT switch.

Figure 4:
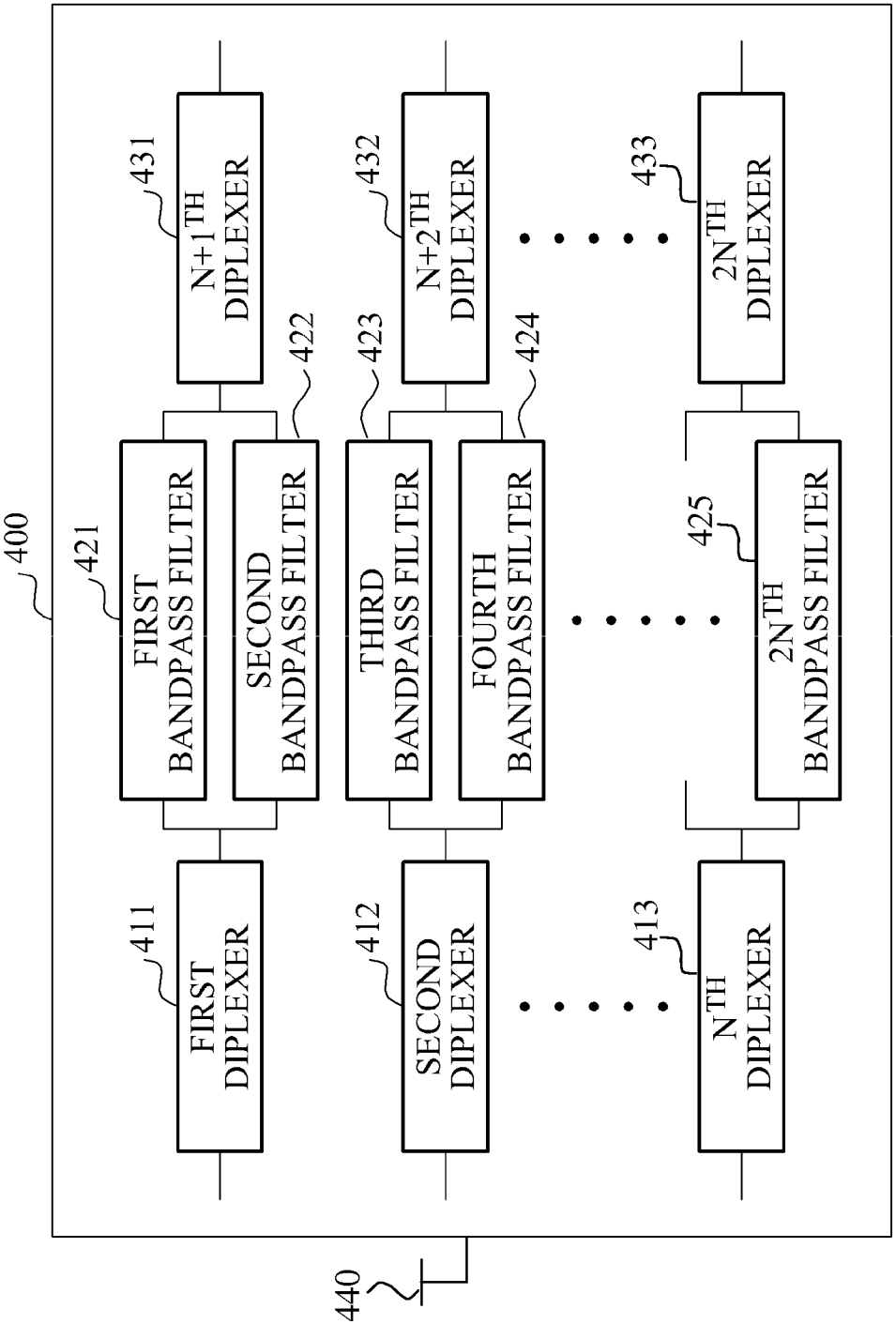
FIG. 4 is a diagram illustrating another example of an RF front end module.

FIG. 4 illustrates another example of an RF front end module 400.

Referring to FIG. 4, the RF front end module 400 includes a plurality of bandpass filters 421, 422, 423, 424, and 425 and at least one of a plurality of illustrated diplexers 411, 412, 413, 431, 432, and 433.

The plurality of the bandpass filters 421, 422, 423, 424, and 425 through which a predetermined band signal is passed, may be connected to rear ends of the at least one of the plurality of illustrated diplexers 411, 412, and 413 and may be connected to front ends of the at least one of the plurality of illustrated diplexers 431, 432, and 433. Also, the plurality of bandpass filters 421, 422, 423, 424, and 425 may be connected to signal lines from a direction of an antenna 440. For example, the first bandpass filter 421 and the second bandpass filter 422 are connected to the signal lines from the direction of the antenna 440, an input port of the first bandpass filter 421 and the second bandpass filter 422 is connected to a rear end of the first diplexer 411, and an output port of the first bandpass filter 421 and the second bandpass filter 422 is connected to a front end of the N+1$^{th}$ diplexer 413. In this instance, the two diplexers 411 and 413 are respectively connected to the front end and the rear end of a single basic unit that includes the two bandpass filters 421 and 422.

However, the diplexers 411, 412, and 413 that are connected to front ends of the plurality of bandpass filters 421, 422, 423, 424, and 425, among the at least one of the plurality of illustrated diplexers 411, 412, 413, 431, 432, and 433 may include a single input port and a dual output port, and the diplexers 431, 432, and 433 that are connected to rear ends of the plurality of bandpass filters 421, 422, 423, 424, and 425 may include a dual input port and a single output port.

As described above, diplexers are connected to a front end and a rear end of bandpass filters, and thus, an RF front end may experience a more enhanced performance.

Figure 5:
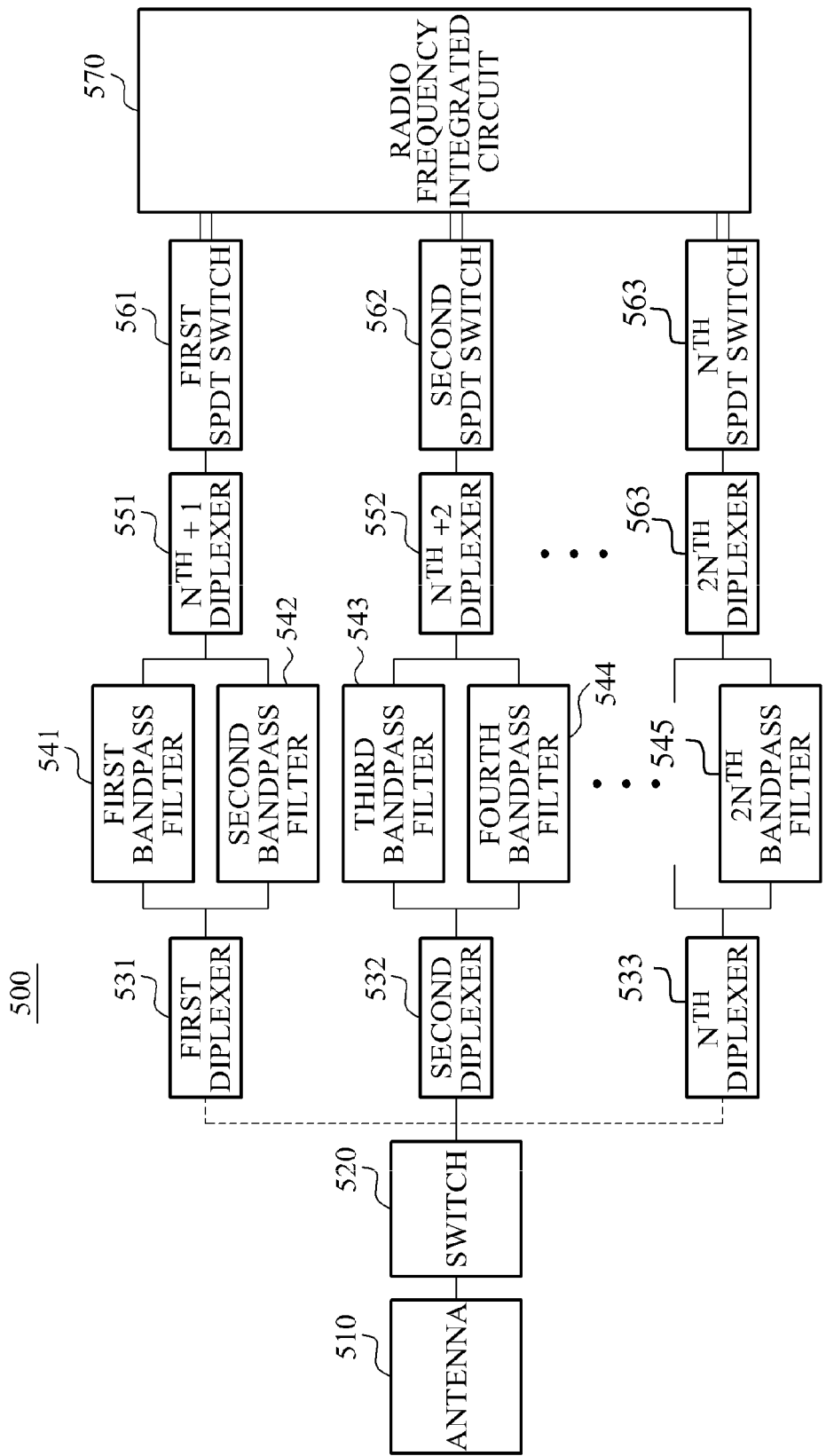
FIG. 5 is a diagram illustrating another example of a multi-band communication module using an RF front end module.

FIG. 5 illustrates another example of a multi-band communication module 500 using an RF front end module.

Referring to FIG. 5, the multi-band communication module 500 includes an antenna 510, a plurality of bandpass filters 541, 542, 543, 544, and 545 at least one of a plurality of illustrated diplexers 531, 532, 533, 551, 552, and 553, and a radio frequency integrated circuit 570.

Here, the antenna 510 may be connected to front ends of the plurality of bandpass filters 541, 542, 543, 544, and 545. In this instance, a switch 520 or a matching circuit may be further included between the antenna 510 and the plurality of bandpass filters 541, 542, 543, 544, and 545. The switch 520 may include at least one of an MEMS switch, a DPDT switch, and an SPDT switch.

Also, a predetermined band signal is passed through the plurality of bandpass filters 541, 542, 543, 544, and 545. Also, diplexers are respectively connected to front ends and rear ends of two bandpass filters. As described above, where the diplexers are respectively connected to the front ends and the rear ends of the two bandpass filters, attenuation characteristics of other bands may increase.

Also, the at least one of the plurality of illustrated diplexers 531, 532, 533, 551, 552, and 553 may be connected to front ends and rear ends of the plurality of the bandpass filters 541, 542, 543, 544, and 545. For example, the first diplexer 531 is connected to the front ends of the first bandpass filter 541 and the second bandpass filter 542, and the N+1$^{th}$ diplexer 551 is connected to the rear ends of the first bandpass filter 541 and the second bandpass filter 542.

However, the radio frequency integrated circuit 570 may be connected to the at least one of the plurality of illustrated diplexers 551, 552, and 553. Here, the radio frequency integrated circuit 570 may include at least one of a low noise amplifier, a mixer, a power amp, and a drive amp.

Referring to FIG. 5, switches 561, 562, and 563, or a matching circuit, may be further included between the radio frequency integrated circuit 570 and the at least one of the plurality of illustrated diplexers 551, 552, and 553. Here, the switches 561, 562, and 563 may use an SPDT switch, and a single SPDT switch 561 may be connected to the single diplexer 551.

As described above, a multi-band communication module using an MEMS switch or a DPDT switch is configured, and thus, an insertion loss of a module may be reduced.

Figure 6:
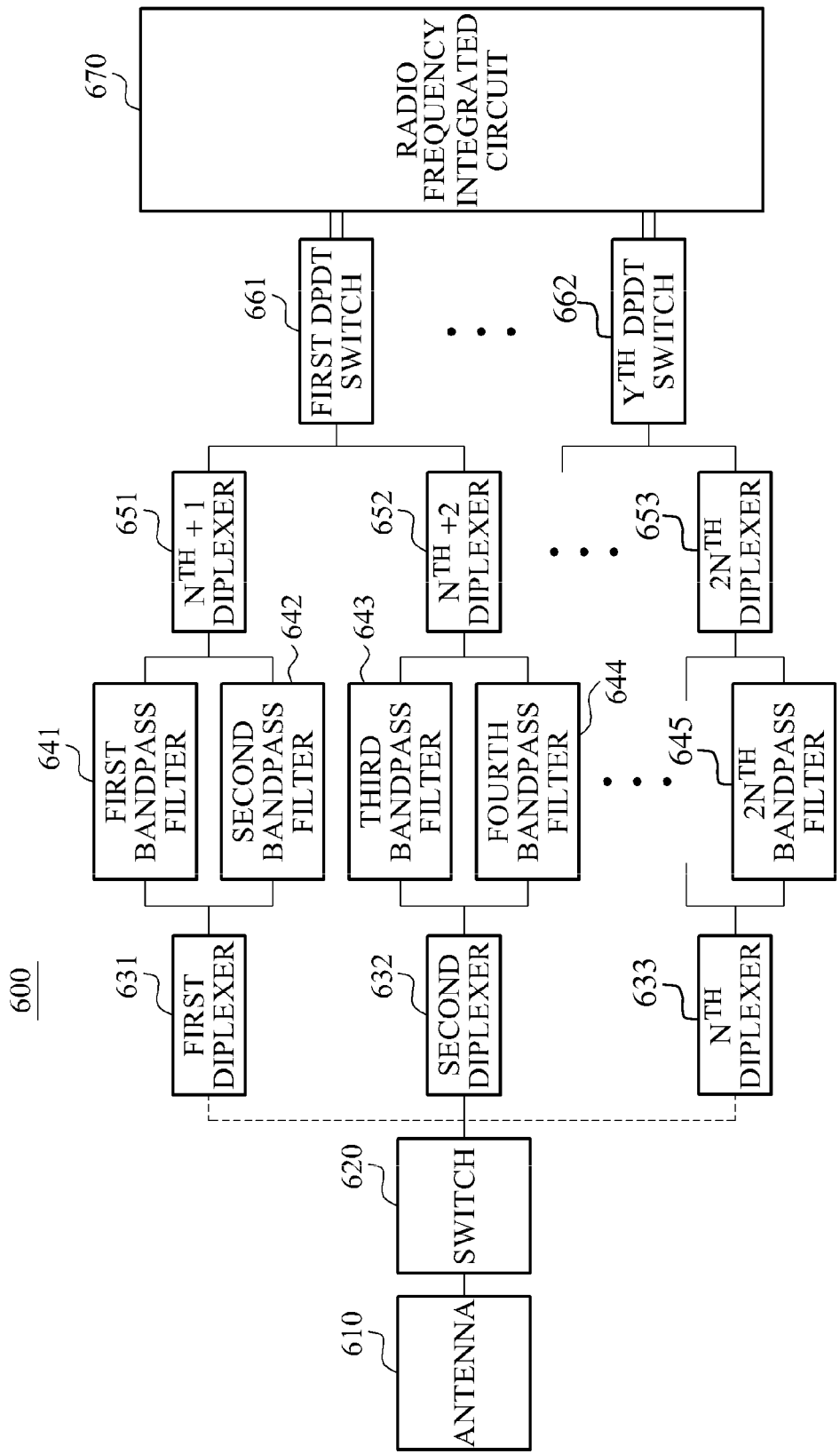
FIG. 6 is a diagram illustrating still another example of a multi-band communication module using an RF front end module.

FIG. 6 illustrates still another example of a multi-band communication module 600 using an RF front end module.

Referring to FIG. 6, the multi-band communication module 600 includes an antenna 610, a plurality of bandpass filters 641, 642, 643, 644, and 645, at least one of a plurality of illustrated diplexers 631, 632, 633, 651, 652, and 653, and a radio frequency integrated circuit 670.

The antenna 610 and the plurality of bandpass filters 641, 642, 643, 644, and 645, the at least one of the plurality of illustrated diplexers 631, 632, 633, 651, 652, and 653, and the radio resource integrated circuit 670 may be configured in the same manner of FIG. 5.

Also, as illustrated in FIG. 5, the multi-band communication module 600 may further include a switch 620 or a matching circuit between the antenna 610 and the plurality of bandpass filters 641, 642, 643, 644, and 645. Here, the switch 620 may include at least one of an MEMS switch, a DPDT switch, and an SPDT switch.

Also, the multi-band communication module 600 may further include switches 661, 662, and 663, or a matching circuit between the radio frequency integrated circuit 670 and the at least one of the plurality of illustrated diplexers 651, 652, and 653. Here, the switches 661, 662, and 663 may use the DPDT switch and a single DPDT switch 661 may be connected to the two diplexers 651 and 652.

Figure 7:
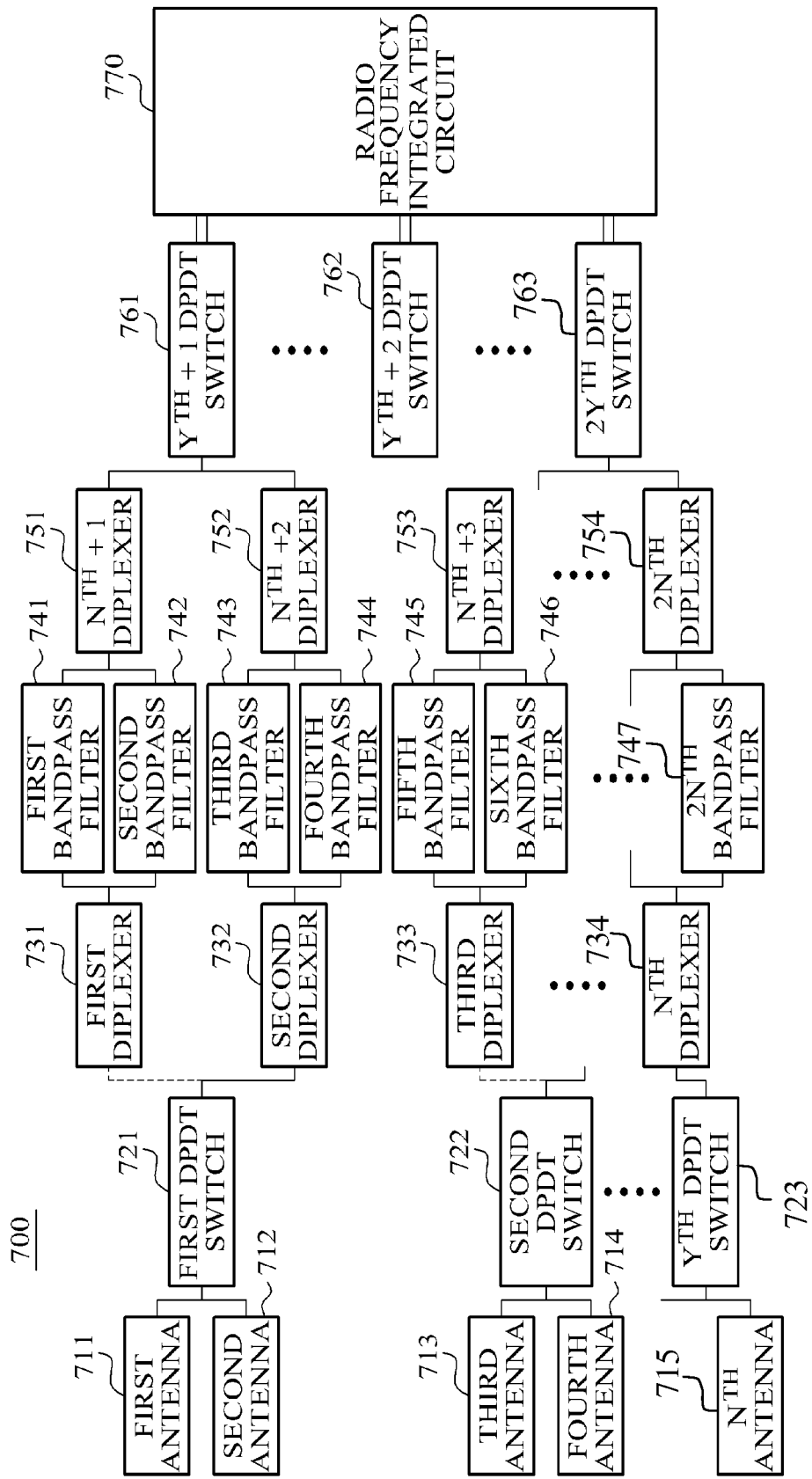
FIG. 7 is a diagram illustrating yet another example of a multi-band communication module using an RF front end module.

FIG. 7 illustrates yet another example of a multi-band communication module 700 using an RF front end module.

Referring to FIG. 7, the multi-band communication module 700 includes a plurality of antennas 711, 712, 713, 714, and 715, DPDT switches 721, 722, 723, 761, 762, and 763, a plurality of bandpass filters 741, 742, 743, 744, 745, 746, and 747, at least one of a plurality of illustrated diplexers 731, 732, 733, 734, 751, 752, 753, and 754, and a radio frequency integrated circuit 770.

The plurality of antennas 711, 712, 713, 714 and 715 may be connected to front ends of the DPDT switches 721, 722, and 723, and two antennas may be connected to each of the DPDT switch 721, 722, and 723. For example, the first antenna 711 and the second antenna 712 may be connected to the front of the first DPDT switch 721.

Also, DPDT switches 721, 722, and 723 may be connected between the plurality of antennas 711, 712, 713, 714, and 715 and the plurality of illustrated diplexers 731, 732, 733, and 734, and a single DPDT switch may be connected to two antennas and two diplexers. For example, the front end of the first DPDT switch 721 is connected to the first antenna 711 and the second antenna 712, and the rear end of the first DPDT switch 721 is connected to the first diplexer 731 and the second diplexer 732.

Here, connections between the plurality of bandpass filters 741, 742, 743, 744, 745, 746, and 747 and the at least one of the plurality of illustrated diplexers 731, 732, 733, 734, 751, 752, 753, and 754 may be configured in the same manner of FIG. 6.

Also, the DPDT switches 761, 762, and 763 may be connected between the radio frequency integrated circuit 770 and the at least one of the plurality of illustrated diplexers 751, 752, 753, and 754. Referring to FIG. 7, the DPDT switches may be connected to two diplexers. For example, a Y+1$^{th}$ DPDT switch 761 may be connected to the N+1$^{th}$ diplexer 751 and the N+2$^{th}$ diplexer 752.

Figure 8:
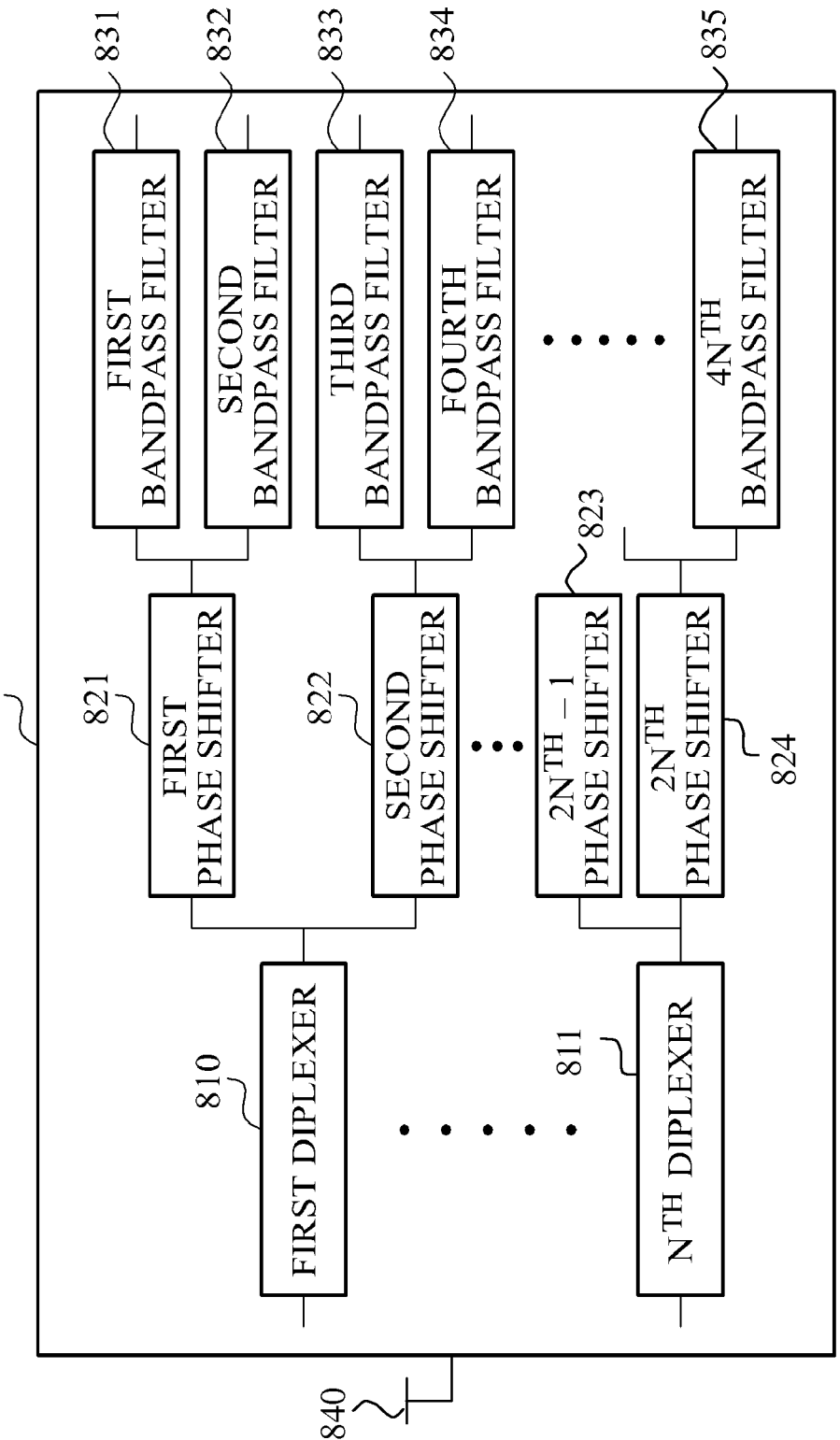
FIG. 8 is a diagram illustrating still another example of an RF front end module.

FIG. 8 illustrates still another example of an RF front end module 800.

Referring to FIG. 8, the RF front end module 800 may include a plurality of bandpass filters 831, 832, 833, 834, and 835, a plurality of phase shifters 821, 822, 823, and 824, and at least one diplexer including a plurality of illustrated diplexers 810 and 811.

Here, the plurality of bandpass filters 831, 832, 833, 834, and 835 through which a predetermined band signal is passed, may be connected to rear ends of the plurality of phase shifters 821, 822, 823, and 824.

Also, the plurality of phase shifters 821, 822, 823, and 824 may be connected to a front end of two bandpass filters among the plurality of bandpass filters 831, 832, 833, 834, and 835, and may be connected to rear ends of the diplexers 810 and 811. To achieve the above, each of the plurality of phase shifters 821, 822 and 823 may include a single input port and a dual output port.

Also, the diplexer 810 may be connected to front ends of two phase shifters of the plurality of phase shifters 821 and 822. Here, the diplexer 810 may include a single input port and a dual output port, and may be connected to a signal line from a direction of an antenna 840.

Figure 9:
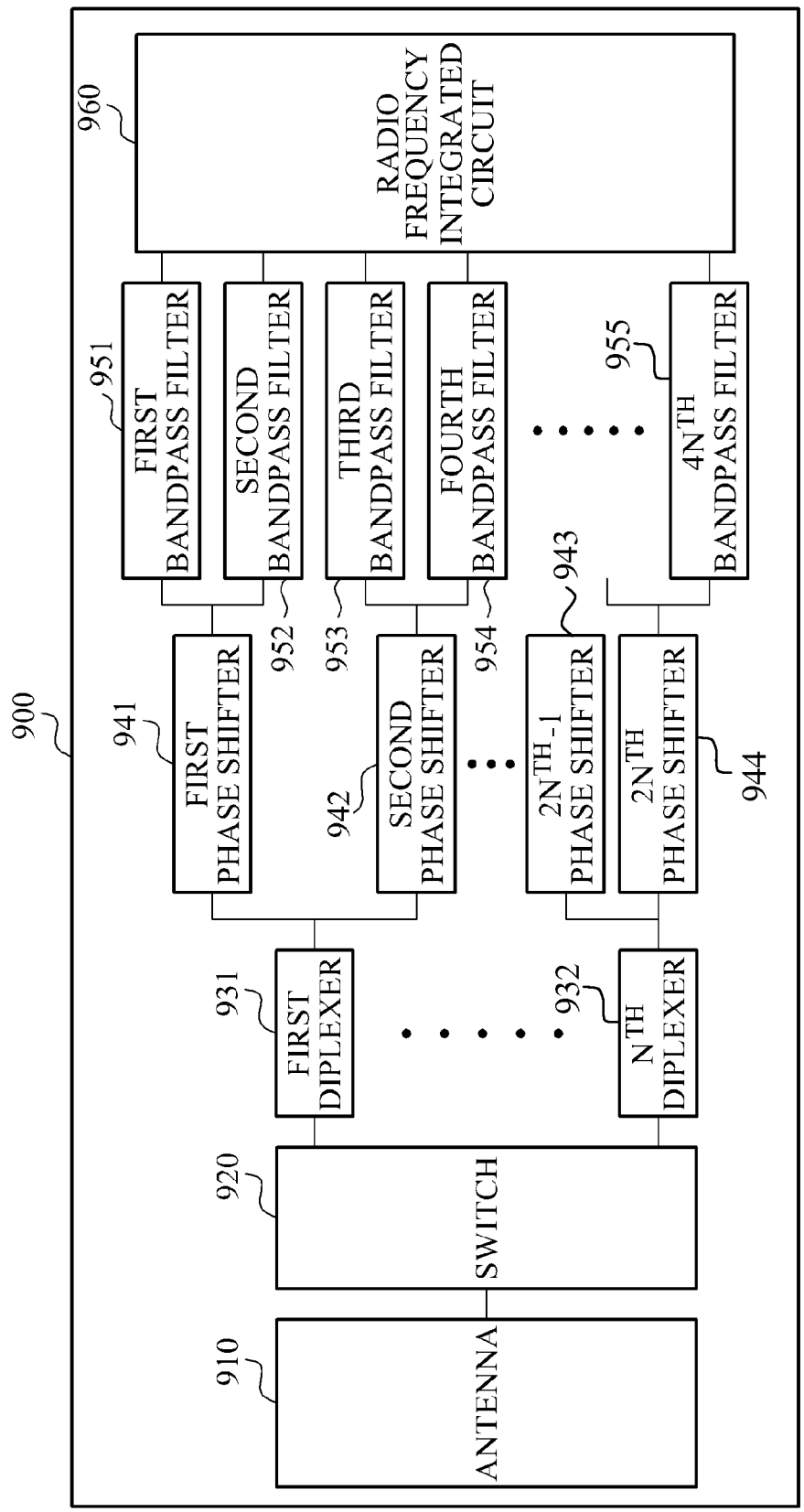
FIG. 9 is a diagram illustrating yet another example of a multi-band communication module using an RF front end module

FIG. 9 illustrates yet another example of a multi-band communication module 900 using an RF front end module.

Referring to FIG. 9, the multi-band communication module 900 may include an antenna 910, a switch 920, a plurality of bandpass filters 951, 952, 953, 954, and 955, a plurality of phase shifters 941, 942, 943, and 944, at least one of a plurality of illustrated diplexers 931 and 932, and a radio frequency integrated circuit 570.

The antenna 910 may be connected to a front end of the switch 920, and the switch 920 may be placed between the antenna 910 and the at least one of the plurality of illustrated diplexers 931 and 932. Also, the at least one of the plurality of illustrated diplexers 931 and 932 may be placed between the switch 920 and the plurality of phase shifters 941, 942, 943, and 944, and may include a single input port and a dual output port.

The plurality of phase shifters 941, 942, 943, and 944 may be placed between the at least one of the plurality of illustrated diplexers 931 and 932 and the plurality of bandpass filters 951, 952, 953, 954, and 955, and a predetermined band signal is passed through the plurality of bandpass filters 951, 952, 953, 954, and 955, and a single phase shifter may be connected to front ends of two bandpass filters.

Also, the radio frequency integrated circuit 960 may be connected to the plurality of bandpass filters 951, 952, 953, 954, and 955.

As described above, an RF front end is configured by using a diplexers and a bandpass filters, and thus, an RF front end and a multi-band communication module that enhances an attenuation characteristic and also prevents deterioration of an insertion loss characteristic is embodied.

Figure 10:
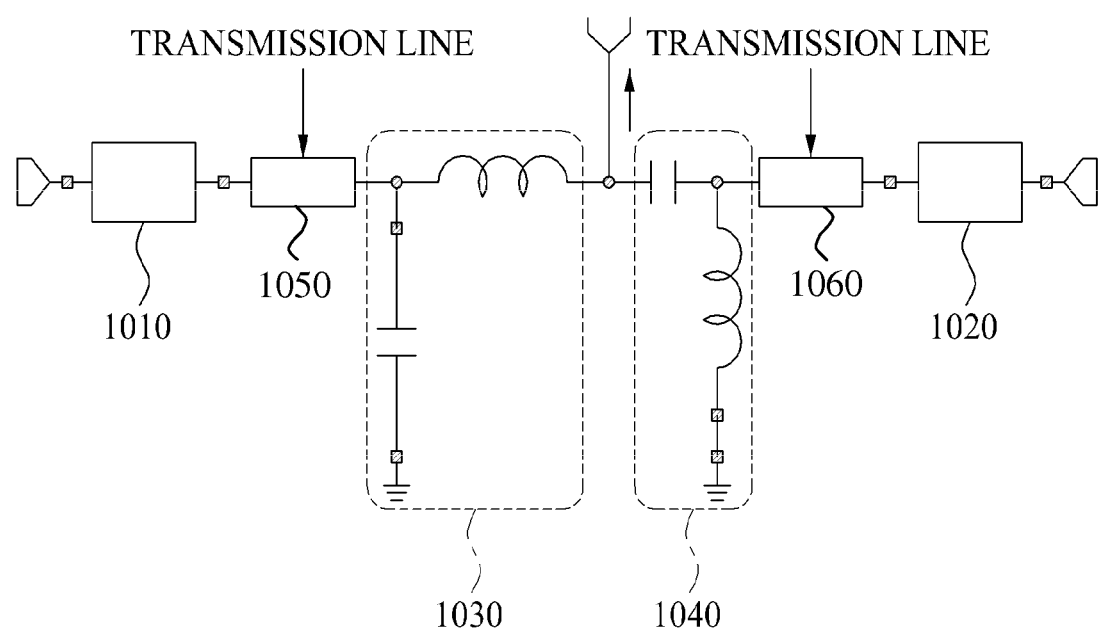
FIG. 10 is a diagram illustrating an example of a configuration of a dual band filter.

FIG. 10 illustrates an example of a configuration of a dual band filter.

Referring to FIG. 10, in a dual band filter, a low pass filter 1030 is embodied to begin with a series inductor, and a high pass filter 1040 is embodied to begin with a capacitor. Each band to be passed has a 180 degree phase difference due to the described embodiment method, and thus, an imaginary number portion of each impedance is offset in a port connected to a switch and an impedance matching characteristic of each pass band may be improved. Also, use of transmission lines 1050 and 1060 (e.g. 50 ohm) being connected to a front end of a filter of each band of FIG. 10 may ease the impedance matching. There may be difficulty in adjusting a characteristic to include matching impedances that are offset with reference to each other, by only using an inductor and a capacitor. In this instance, use of a 50 ohm transmission line may facilitate the impedance matching.

Figure 11:
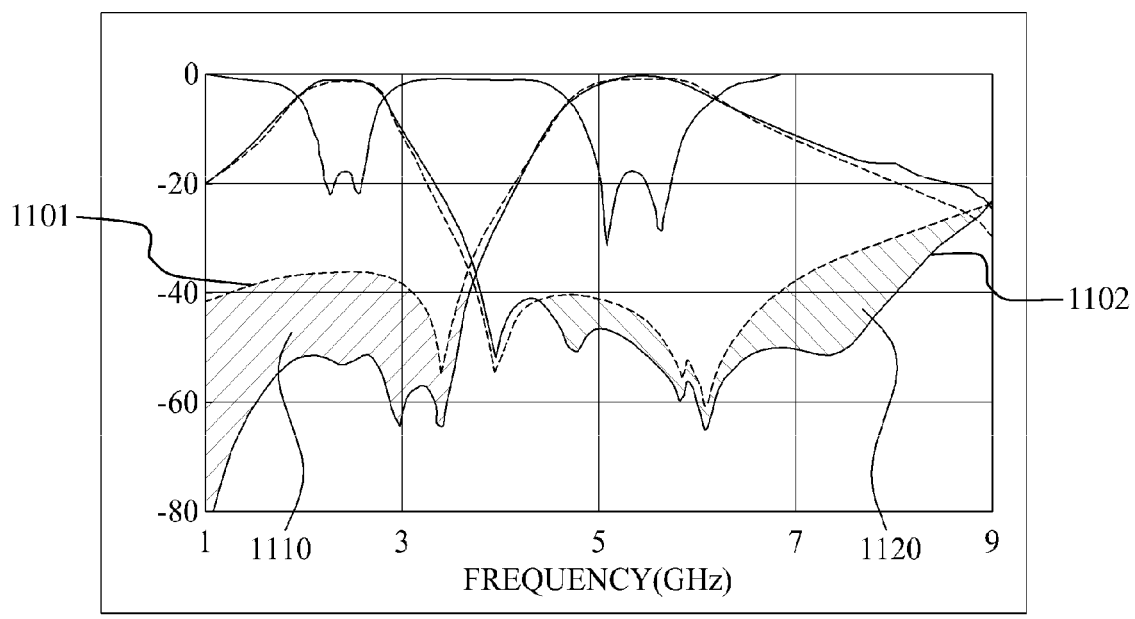
FIG. 11 is a diagram illustrating an example of a bandpass characteristic.

FIG. 11 illustrates an example of a bandpass characteristic.

Referring to FIG. 11, a dotted line 1101 indicates a pass characteristic of the related art, and a solid line 1102 indicates a pass characteristic from an antenna (not illustrated) to each port where a dual band is configured by using diplexers. Referring to the pass characteristics 1101 and 1102 of each band, it is found that attenuation characteristics 1110 and 1120 are improved by more than 10 dB where the dual band is configured by using the diplexers, as compared with the pass characteristic 1101 of the related art. More specifically, where a switch of the related art is used instead of the diplexers, the pass characteristic from the antenna to each band port may not differ greatly from the pass characteristic of the bandpass filter of the related art.

As described above, an RF front end is configured by using diplexers and bandpass filters, and a multi-band communication module is configured by using the RF front end, thereby enhancing an attenuation characteristic, preventing deterioration of an insertion loss characteristic, and improving an insertion loss of a module.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An RF front end module, comprising:
a bandpass filter through which a predetermined band signal is passed;
another bandpass filter through which another predetermined signal is passed;
a diplexer being operatively connected to front ends of the bandpass filter and the other bandpass filter; and
a phase shifter between a front end of the bandpass filter and a rear end of the diplexer.

2. The module of claim 1, further comprising:
another phase shifter,
wherein the phase shifter is connected to the front end of the bandpass filter and a front end of the other bandpass filter, and
wherein the diplexer is connected to front ends of the phase shifter and the other phase shifter.

3. A multi-band communication module, comprising:
a bandpass filter through which a predetermined band signal is passed;
a diplexer being operatively connected to the bandpass filter;

a radio frequency integrated circuit being operatively connected to the diplexer; and a switch or a matching circuit between the diplexer and the radio frequency integrated circuit.

4. The module of claim 3, further comprising:

another bandpass filter through which another predetermined signal is passed, wherein the diplexer is operatively connected to rear ends of the bandpass filter and the other bandpass filter.

5. The module of claim 3, further comprising:

another bandpass filter through which another predetermined signal is passed; and another diplexer being operatively connected to front ends of the bandpass filter and the other bandpass filter, wherein the diplexer is operatively connected to rear ends of the bandpass filter and the other bandpass filter.

6. The module of claim 3, further comprising:

an antenna being operatively connected to a front end of the bandpass filter; and another switch or another matching circuit between the antenna and the bandpass filter.

7. The module of claim 3, wherein the radio frequency integrated circuit comprises a low noise amplifier, or a mixer, or a power amp, or a drive amp, or any combination thereof.

8. The module of claim 3, wherein the switch comprises a Micro Electronic Mechanical System (MEMS) switch, or a single-pole double-throw (SPDT) switch, or a double-pole double-throw (DPDT) switch, or any combination thereof.

9. A multi-band communication module, comprising:

a bandpass filter through which a predetermined band signal is passed;

a diplexer being operatively connected to the bandpass filter;

a radio frequency integrated circuit being operatively connected to the bandpass filter;

a phase shifter between a front end of the bandpass filter and a rear end of the diplexer;

another bandpass filter through which another predetermined signal is passed; and another phase shifter, wherein the phase shifter is connected to the front end of the bandpass filter and a front end of the other bandpass filter, and wherein the diplexer is connected to front ends of the phase shifter and the other phase shifter.

10. A multi-band communication module, comprising:

a bandpass filter through which a predetermined band signal is passed;

a diplexer being operatively connected to the bandpass filter;

a radio frequency integrated circuit being operatively connected to the bandpass filter;

a phase shifter between the bandpass filter and the diplexer;

an antenna being operatively connected to a front end of the diplexer; and a switch or a matching circuit between the antenna and the diplexer.

11. A multi-band communication module, comprising:

a bandpass filter through which a predetermined band signal is passed;

a diplexer being operatively connected to the bandpass filter;

a radio frequency integrated circuit being operatively connected to the bandpass filter;

a phase shifter between the bandpass filter and the diplexer; and a switch or a matching circuit being operatively connected to a front end of the diplexer.

* * * * *